United States Patent
Elliott

[15] 3,639,848
[45] Feb. 1, 1972

[54] TRANSVERSE DIGITAL FILTER

[72] Inventor: James W. Elliott, Largo, Fla.
[73] Assignee: Electronic Communications Inc., Petersburg, Fla.

[22] Filed: Feb. 20, 1970
[21] Appl. No.: 13,098

[52] U.S. Cl. ....328/167, 328/160, 328/119, 340/347
[51] Int. Cl. ....H03k 13/02
[58] Field of Search ....328/160, 167, 119; 340/347

[56] References Cited

UNITED STATES PATENTS 3,314,015 4/1967 Simone ....328/160 X
3,370,292 2/1968 Deerfield ....328/167 X

*Primary Examiner*—John S. Heyman
*Attorney*—Sandoe, Hopgood and Calimafde

[57] ABSTRACT

A digital transversal filter converts an input analog signal into a plurality of digital components which are transferred into a storage device. Those components are thereafter sequentially multiplied by predetermined coefficients stored in a circulating memory. The combined products of the coefficients and the components constitute an output digital word which is thereafter converted to an analog signal bearing a predetermined functional relationship to the input signal.

10 Claims, 3 Drawing Figures

PATENTED FEB 1 1972 3,639,848

INVENTOR.
JAMES W. ELLIOTT

BY
Sandoe, Hopgood & Calimafde
ATTORNEYS

TRANSVERSE DIGITAL FILTER

The present invention relates generally to filters, and more particularly to filters utilizing digital techniques.

Recent developments in communication systems and related areas have placed seemingly contradictory requirements on the components for use in those systems. The increased complexity and sophistication of these systems has required increased precision and reliability of each of its constituent components. At the same time, the increased number of such components used in a system and the usually restricted space available for housing these components have necessitated the reduction in size as well as the decreased power consumption of the components.

One basic approach toward reducing the size of components while maintaining the requisite accuracy and reliability has been to implement analog functions by the use of digital techniques. The use of digital circuits does away with the need for the bulky and usually relatively imprecise analog components. Moreover, the relatively recent introduction of MSI and LSI techniques has remarkably increased the capacity for fabricating highly complex digital circuitry on single or multiple chips of semiconductor material in a small volume. As a result, the potential for decreasing the size requirements of a system by the use of digital techniques is further and significantly increased.

One basic component of most communication systems is a filter which operates on an input analog signal to produce an output analog signal having a predetermined relationship to the input signal. Typical filters include a band-pass filter which passes signals lying within a preselected frequency band centered around a center frequency, and rejects all signals at frequencies outside that band. For optimum performance the frequency response of the band-pass filter has steep, practically vertical sides, and a flat top. It is also generally desirable that the relation between frequency and phase-shift in the pass band be as linear as possible. Other commonly employed filters include low-pass and high-pass filters which respectively pass only signals at frequencies below and above a predetermined frequency.

The conventional analog filter employs inductors and capacitors having predetermined parameters and connected to form a network capable of providing the desired frequency response. As noted above, such components are bulky in size and are inherently inaccurate, as their parameters are precise only to fabrication tolerances and can vary over a period of time.

To improve the accuracy of the analog filters where required, crystals having known and relatively precise frequency characteristics have been used as frequency determining elements. While such crystals often provide increased accuracy of response, they suffer from the same limitation of size as in the more conventional analog filters and moreover, considerably increase the cost of the filter.

To overcome the problems inherent in the use of analog filters, attempts have been made to implement the desired frequency response by the use of digital techniques. This is possible since the general analog equation for frequency response, namely: $Y(jw)=F(jw)\cdot X(jw)$, in which $X(jw)$ is the input analog signal, $Y(jw)$ is the output analog signal, and $F(jw)$ is the frequency response of the filter, can be converted to a form suitable for implementation by digital techniques, in which the input analog signal is initially converted to an input binary word. The latter can thereafter be processed in accord with a predetermined operation to derive an output digital word. By converting the output digital word to an equivalent analog signal, an output of the filer is obtained having the desired functional relation to the input signal.

The previous designs of digital filters have, however, required the use of complex switching circuitry to permit the time-sharing of a multiplier with a multiplicity of inputs, to produce the individual products of coefficients and components of the input digital word to produce the output digital word. Moreover, in the known digital filters the components of the input digital word are conventionally stored in a noncirculating delay line or shift register having a plurality of outputs, thus preventing the fabrication of that delay line by MOS techniques. The benefits of MSI and LSI techniques, including reduced volume, for this reason are not available in the fabrication of the known digital filters.

Other deficiencies in the known digital filters include the difficulty in adapting the coefficient storage for performing different filtering functions, and in performing time-sharing filtering operations such as on different input signals, or by the use of different filters on a common input signal.

Thus, while digital filters have the potential of providing significantly improved performance in many areas in comparison with analog filters, their full potential remains unrealized largely as a result of the several disadvantages outlined above.

It is thus an object of the present invention to provide an improved digital filter having high accuracy, and reduced size and power requirements.

It is another object of the invention to provide a digital filter capable of being readily fabricated by MSI and LSI techniques.

It is a further object of the present invention to provide a digital filter having the capability of being readily adapted to achieve different desired frequency-response characteristics.

It is yet another object of the present invention to provide a digital filter of the type described which may be readily time-shared to perform different filtering operations on a single input signal, and/or a common filtering operation on a plurality of input signals.

Broadly described, the present invention resides in the provision of a digital filter in which predetermined coefficients are stored in a circulating memory and the digital word components, derived from an input analog signal, are stored in a transveral delay line which may be in the form of a shift register. Control signals periodically transfer one of the digital components from the delay line and the corresponding coefficient from the coefficient memory to a multiplier which forms the product of those two inputs.

The products of the coefficients and stored digital components are periodically inserted and stored in an accumulator, the sum of those products collectively defining an output digital word. That output digital word is thereafter converted to an analog signal having the desired functional relation to the input analog signal, and the word components and the coefficents are respectively recirculated back to their positions in the delay line and coefficient memory.

To increase the speed of operation of the filter, the coefficient memory, multiplier, and delay line may be each divided into two or more sections. The number of required clocking operations on the delay line and coefficient memory sections for a given input signal sampling operation are thereby reduced and the speed of operation of the filtering is correspondingly increased.

To the accomplishment of the above and to such further objects as may hereinafter appear, the present invention relates to the design and manner of operation of a digital transversal filter, substantially as defined in the appended claims and as described in the following specification taken together with the accompanying drawing in which:

Figures 1, 2, 3:
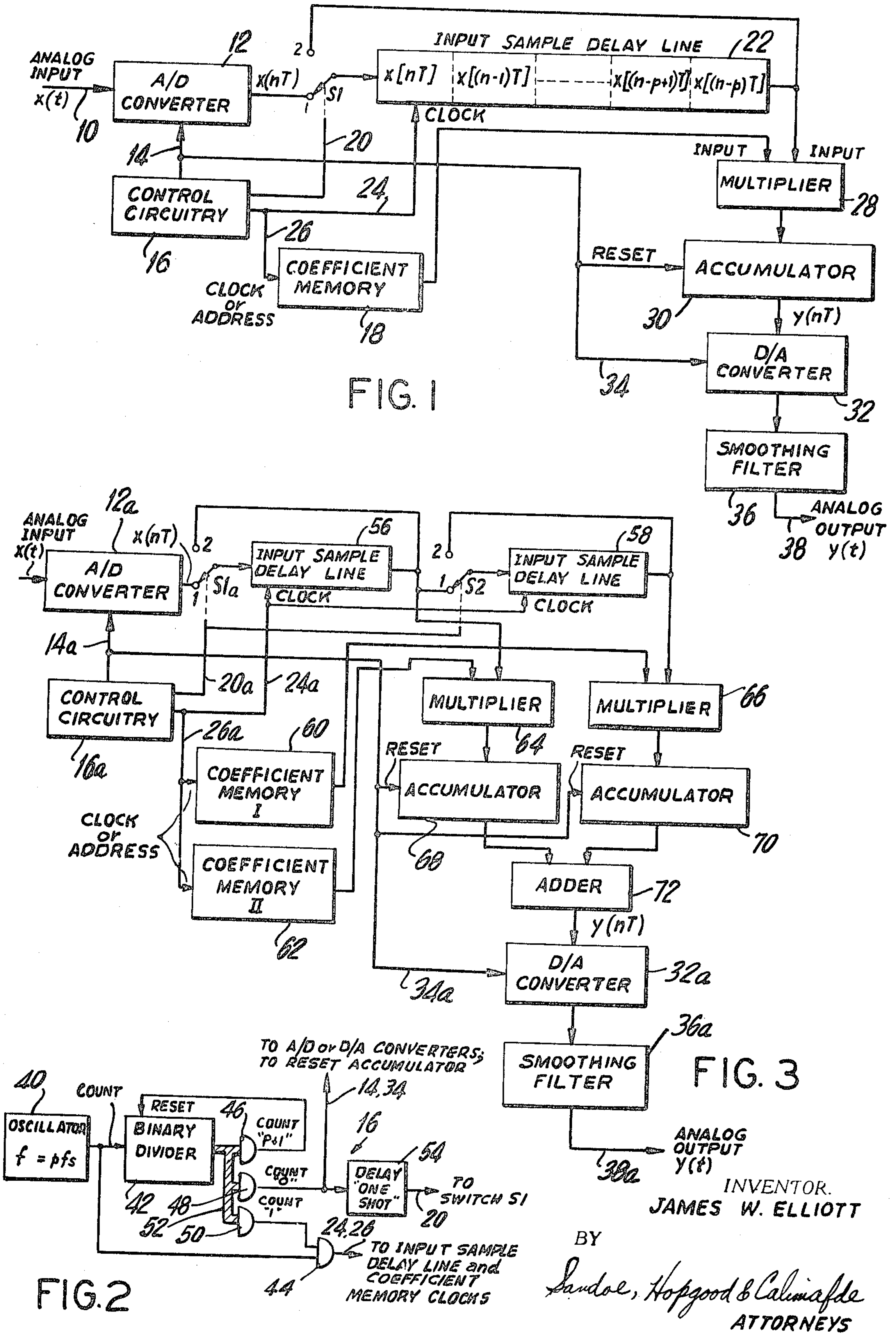
FIG. 1 is a block diagram schematically showing a digital transversal filter in accord with the present invention.
FIG. 2 is a schematic diagram of the control circuitry of the filter of FIG. 1.
FIG. 3 is a block diagram of an alternative design of a digital transversal filter capable of achieving increased speed of operation.

Referring to the drawing, the digital filter of the invention comprises an input terminal 10 at which an input analog signal $x(t)$ is applied. That signal is then applied to the input of an analog-to-digital converter 12 which receives periodic sampling signals on a line 14 from a control circuit 16. The output of converter 12 is in the form of a multibit binary signal $X(nT)$ which represents, in digital form, the input analog signal.

The basic mathematical model of a filter may be represented by the general equation $$y(nt)=\sum_{i=0}^{i=p} a_i x\,(nT-it),$$

where $y(nT)$ is the output signal of the filter, and $a_i$ is a coefficient. It can be observed from this equation that the output digital signal $y(nT)$ can be implemented by deriving and then summing the products of (*a*) the sampled components of the input digital signal $x(nT)$, and (*b*) the coefficients $a_i$. The nature of the coefficients and sequence of their storage is determined by the desired functional relation between the input and the output signals $x(t)$ and $y(t)$.

In the filter of the invention, the coefficients $a_o$–$a_p$ are stored in a circulating coefficient memory 18. When a switch S1, controlled by a timing signal on line 20, derived from circuit 16, is in position 1 in FIG. 1, the sampled words of the input digital signal $x(nT)$ are sequentially transferred into an input sample delay line 22 which may be a p-shift register. In this manner, the sampled words or components of the input sample digital word are stored in sequence in different positions in line 22. As each newly sampled digital word is shifted into delay line 22, each preceding word is shifted one position down the line, and the oldest word stored in the line is lost. Upon the completion of a sampling operation on the input analog signal, each of the sample words of the corresponding input digital signal $x['(n-p)T]\ldots X[nT]$ is stored in delay line 22.

Upon the completion of an input sampling period, switch S1 in response to a signal from control circuit 16, is moved to position 2 in which delay line 22 is decoupled from converter 12, and the last output stage of line 22 is connected to the first or input stage of that line to establish a recirculating state for the line. At this time clock signals on lines 24 and 26 are respectively applied to delay line 22 and to memory 18. Each clock signal causes one coefficient and the corresponding word stored in the last stage of line 22 to be applied to the inputs of a multiplier 28, which forms the product of these signals and applies that product to an accumulator 30, which is reset to zero at the time switch S1 is in the 1 position.

After all the products of each of the stored input sample words and the corresponding coefficients are formed and then inserted into accumulator 30, a signal is produced by control circuit 16 which causes the accumulator sum, which defines the output digital signal $y(nT)$, to be gated to a digital-to-analog converter 32. Converter 32 at that time receives a sampling signal from circuit 16 at a line 34. The stored input sample words and the coefficients have at this time all recirculated back to their original positions in line 22 and memory 18 respectively. The analog output signal from converter 32, is applied to the input of smoothing filter 36, the output of which at an output terminal 38 is the desired output analog signal $y(t)$. The latter signal has the desired functional relation to the input analog signal $x(t)$.

The operation of the various sections of the digital filter in the manner described above is controlled by suitable timing signals produced by control circuit 16. That circuit, as illustrated in greater detail in FIG. 2, comprises an oscillator 40 producing signals at a frequency $f$ which is equal to $pf_s$, where $f_s$ is the sampling frequency, that is, the rate at which the input analog signal is sampled at converter 12.

The output of oscillator 40 is connected to the input of a binary divider or counter 42, and to one input of an AND-gate 44. Selected stages of counter 42 are connected to the inputs of AND-gates 46, 48, and 50, those selected connections being illustrated schematically by the crosshatched connection area 52. The output of gate 46 is connected to the reset terminal of counter 42, and the output of gate 48 is connected to the input of a delay one-shot multivibrator 54.

In operation, assuming that counter 42 is initially at zero, gate 48 is uniquely enabled and produces an output signal which is applied to converters 12 and 32, and to the reset terminal of accumulator 30 to reset the latter to zero. The output signal of gate 48 is delayed at multivibrator 54 and then applied to switch S1, which may be in the form of a logic gate, to establish switch S1 in its 1 position. On the receipt of the next or "1 count pulse at the output of counter 42, the output of gate 48 is disabled, causing switch S1 to move to the 2 position, and an output signal is produced at the output of gate 50. The output of gate 50 in turn enables gate 44 for all counts of counter 42 from 1 through $p$, causing gate 44 to provide clock pulses at the frequency $f$ to delay line 22 and coefficient memory 18. Those clock pulses, as noted above, periodically shift the stored sample components from delay line 22 and memory 18 to multiplier 28.

When counter 42 reaches a count of $p$ the operation of the filter for a given input sampling period is completed, that is, the $p$ products of all coefficients and word components have been formed and stored in accumulator 30. The next or $p+1$ count signal applied to counter 42 enables the output of gate 46 causing counter 42 to be reset to zero, and thereupon reenables gate 48 to begin a new input sampling and output signal conversion at converters 12 and 32 respectively, and reset accumulator 30.

The digital filter illustrated in FIG. 1 has the capability of performing a highly accurate filtering operation on an input signal. The accuracy of the filtering may be increased by increasing the number of sample words in delay line 22 and the corresponding number of the associated coefficients stored in the circulating coefficient memory. However, limitations on the maximum rate at which the delay line may be clocked limit the number of words that may be processed during a given sampling period. The filter accuracy is thus limited by the maximum permissable clock or data transfer rate of the delay line. The speed of operation and thus the accuracy of the filter may be increased by modifying the filter as illustrated in FIG. 3, in which elements corresponding to those in FIG. 1 are identified by corresponding reference numerals to which the suffix *a* is appended.

The single input sample delay line of the FIG. 1 embodiment is replaced by first and second input sample delay lines 56 and 58, and the gating switch S1 is replaced by gating switches **S1*a* and S2 which are controlled by a timing signal at line 20*a* produced by control circuit 16*a*. The signal coefficient memory, the single multiplier, and the single accumulator of the FIG. 1 embodiment, are replaced respectively by first and second circulating coefficient memories 60 and 62, first and second multipliers 64 and 66, and first and second accumulators 68 and 70. The outputs of accumulators 68 and 70 are connected to inputs of an adder 72, the output of which is connected to a digital-to-analog converter 32*a***.

The storage capacities of the delay lines (shift registers) 56 and 58 are half that of the single delay line in the FIG. 1 embodiment, and the last stage of line 56 is connected to the first or input stage of line 58 in the period in which switch S2 is in the "1" position, during which time the input to line 56 is coupled through switch **S1*a* to the output of analog-to-digital converter 12*a*. Thus all stages of delay lines 56 and 58** are loaded with p words during the sampling period.

During the data transfer period, i.e., When switches **S1*a* and S2 are in their 2 positions, the output stages of each line 56, 58 are coupled back to their respective input stages to provide a recirculating path for both lines. Memories 60 and 62 each contain one-half of the coefficients respectively associated with those sample words shifted into delay lines 56 and 58. During each clock period following the initial sampling period, the products of corresponding portions of memories 60, 62 and lines 56, 58 are respectively formed in multipliers 64 and 66, and transferred to accumulators 68 and 70. The outputs of accumulators 68, 70 are summed in adder 72 to form the output digital word $y(nT)$ which is processed in converter 32*a* to form the output analog signal as described above with reference to the FIG. 1** embodiment.

The increase in the speed of operation of the FIG. 3 embodiment with respect to the filter of FIG. 1 can now be understood. Assuming that $p$=100 and the maximum clock rate of line 22 in FIG. 1 is 1 mc., the maximum sampling rate $f_s$ of the FIG. 1 digital filter is 1 cm./100 or 10 kc. For the same value of $p$ in the FIG. 3 embodiment, each line 56, 58 need be clocked only 50 times during a sampling period, so that the maximum sampling rate for the latter embodiment becomes 1 mc./50 or 20 kc., i.e., a rate twice that of the FIG. 1 embodiment. The sampling frequency and thus the operating speed of the filter may be still further increased, if desired, by increasing the number of lines, coefficient memories, multipliers and accumulators by the necessary factor as will be understood.

The filter of the present invention thus provides a highly accurate filtering operation on an input analog signal by the use of digital techniques. The use of the circulating memory permits the sequential formation of the coefficient component products without the complex time-sharing switching circuitry required in the prior art digital filters of this type. Moreover, the fact that the input sample components are circulated through the delay lines permits the use of a delay line (shift register) having only a single output. As a result, a multiple bit MOS multiple bit shift register may be used, making the filter of the invention amenable to fabrication by MSI or LSI techniques.

The filtering transfer function may be readily modified by varying the coefficients stored in the coefficient memory. Thus the filter of the invention may be readily adapted simple by cycling a different set of coefficients from the memory at any given operating period.

To increase the flexibility of the filter of the invention, time sharing may be readily provided between a single input and two or more filters, between a single filter and two or more inputs, or between two or more inputs and two or more filters by varying the cycling operation of the coefficients and input samples to the multiplier inputs.

As noted above, the input sample delay line may be conveniently in the form of a shift register having a storage capacity of $pr$ bits, where $p$ is the number of sample words or components stored in the delay line, and $r$ is the number of bit resolution of each word produced at the input analog-to-digital converter. In an alternate arrangement, the delay line could be a parallel word delay line consisting of $r$ delay lines or shift registers which are each $p$ bits long. The circulating coefficient memory may be a magnetic core, read-only memory, or any other suitable memory from which coefficient data may be sequentially read out in response to input clock or address signals.

Thus while several embodiments of the invention have been herein specifically described, it will be apparent that many variations may be made therein, all without departing from the spirit and scope of the invention.

I claim

1. A digital filter for producing an output signal having a predetermined desired relation to an input signal, said filter comprising an input terminal for receiving the input analog signal, means coupled to said input terminal for converting the analog signal to a digital signal having a plurality of binary components, first means for storing said binary components, circulating memory means for containing a plurality of predetermined coefficient numbers corresponding to the relation between the output and input signals, means coupled to said first storing means and to said memory means for sequentially forming the respective products of said components and corresponding ones of said coefficient numbers, thereby to form an output digital word, second means coupled to said product forming means for storing the respective products of said components and said coefficient numbers, and means coupled to the output of said second storing means for converting said output digital word to the output signal.

2. The digital filter of claim 1, further comprising timing means, and switch means interposed between said input word converting means and said first-mentioned storing means, and responsive to signals from said timing means for periodically coupling and decoupling said input word converting means and said first storing means.

3. The digital filter of claim 2, in which said timing means further comprises means for supplying, when said first storing means is decoupled from said input word converting means, control signals to said first storing means and said memory means for causing said first storing means and said memory means to respectively sequentially transfer one of said components and one of said coefficient numbers to said product forming means.

4. The digital filter of claim 3, in which said timing means further comprises means for, when said first storing means is coupled to said input word converting means, providing control signals to the latter for periodically deriving and transferring said components into said first storing means.

5. The digital filter of claim 2, in which said switch means when operative to decoupled said input word converting means and said storing means, defines means for coupling the input and output of said storing means.

6. The digital filter of claim 5, in which said storing means comprises shift register means operative as a recirculating unit when its output is coupled to its input in response to the operation of said switch means.

7. The digital filter of claim 1, further comprising timing means coupled to said first storing means and said memory means for periodically transferring said binary components and said coefficient numbers to said products forming means.

8. The digital filter of claim 1, in which said first and second storing means, said memory means, and said product forming means each comprise first and second sections, and including means for transferring a first group of said digital components to the first section of said first storing means and a second portion of said digital components to the second section of said first storing means, the first section of said product forming means defining means for forming the products of the components in said first section of said first storing means and said coefficient numbers in said first section of said memory means, and said second section of said product forming means defining means for forming the products of said components in the second section of said first storing means and said coefficient numbers in the second section of said memory means.

9. The digital filter of claim 8, further comprising timing means coupled to said storing means and said memory means for periodicially transferring said digital components ans said coefficient numbers in said first and second sections of said first storing means and memory means respectively, to the corresponding one of said first and second sections of said product forming means.

10. The digital filter of claim 9, further comprising first and second accumulator means respectively coupled to said first and second sections of said product forming means, and summing means interposed between and coupled to said first and second accumulator means and said output work converting means for forming the sum of said products, said products sum defining said output digital word.

* * * * *